United States Patent [19]
Jensen et al.

[11] Patent Number: 6,085,596
[45] Date of Patent: Jul. 11, 2000

[54] PRESSURE SENSOR HAVING AN INSULATING LAYER AND FLUID TIGHT AMORPHOUS METAL LAYER

[75] Inventors: Niels Due Jensen; Tina Romedahl Brown; Karsten Dyrbye; Per Ellemose Andersen, all of Bjerringbro, Denmark

[73] Assignee: Grundfos A/S, Bjerringbro, Denmark

[21] Appl. No.: 08/827,751

[22] Filed: Apr. 11, 1997

[30] Foreign Application Priority Data

Apr. 12, 1996 [DE] Germany ............... 196 14 458

[51] Int. Cl.[7] ................. G01L 9/00; G01L 9/16
[52] U.S. Cl. ............................................. 73/754
[58] Field of Search .................. 73/715, 716, 717, 73/718, 719, 720, 721, 722, 723, 724, 725, 726, 727, 754, 756; 257/419; 361/283.1

[56] References Cited

U.S. PATENT DOCUMENTS

| | | |
|---|---|---|
| 3,505,634 | 4/1970 | Von Vick . |
| 4,686,764 | 8/1987 | Adams et al. .............. 29/592 |
| 4,732,042 | 3/1988 | Adams ....................... 73/706 |
| 4,737,756 | 4/1988 | Bowman . |
| 4,770,036 | 9/1988 | Porth et al. . |
| 4,797,166 | 1/1989 | Von Ellmen et al. . |
| 4,880,482 | 11/1989 | Hashimoto et al. . |
| 4,897,360 | 1/1990 | Guckel et al. . |
| 4,999,317 | 3/1991 | Lu et al. . |
| 5,062,302 | 11/1991 | Peterson et al. ............. 73/754 |
| 5,095,401 | 3/1992 | Zavracky et al. .......... 361/283.1 |
| 5,104,848 | 4/1992 | Miedema et al. . |
| 5,202,572 | 4/1993 | Kobayashi . |
| 5,549,797 | 8/1996 | Hashimoto et al. . |
| 5,631,428 | 5/1997 | Catanescu et al. ........... 73/724 |
| 5,801,068 | 9/1998 | Sooriakumar et al. . |

FOREIGN PATENT DOCUMENTS

| | | |
|---|---|---|
| 0537710 | 4/1993 | European Pat. Off. . |
| 0 548 470 | 6/1993 | European Pat. Off. . |
| 0 588 603 | 3/1994 | European Pat. Off. . |
| 36 06 850 | 9/1987 | Germany . |
| 3814444 | 11/1988 | Germany . |
| 4216150 | 11/1992 | Germany . |
| 44 02 085 | 8/1994 | Germany . |
| 440185 | 11/1994 | Germany . |
| 44 15 984 | 11/1995 | Germany . |
| 59-231430 | 12/1984 | Japan . |

OTHER PUBLICATIONS

European Search Report completed Jan. 20, 1999 in European Patent Application EP 97 10 5395.

"Phase Separation in Interactions of Tantalum–Chromium Alloy on Si", C. J. Palmstrom, J. Gyulai and J. W. Mayer, Published in J. Vac. Sci. Technol. A 1(2), Apr.–Jun. 1983, Copyright 1983 Americn Vacuum Society.

ISBN 0–87339–294.9, "Metallic Glasses Update", Micromechanics of Advanced Materials 1995 (no month).

*Primary Examiner*—William Oen
*Attorney, Agent, or Firm*—Jacox, Meckstroth & Jenkins

[57] ABSTRACT

The invention relates to a pressure or differential pressure sensor comprising a membrane with at least one measuring element located thereon, as well evaluation electronics for measuring the membrane deflection. The membrane is covered against environmental influences with a protective layer and is gripped within a mounting in a pressure tight manner. The protective layer is composed of a fluid tight amorphous metal layer, a so called metal glass layer which with the interposing of an electrically insulating layer, is directly deposited onto the membrane, the measuring element located thereon and where appropriate, onto further electronic components located thereon. In this manner, on the one hand, the membrane is protected but on the other hand it may be deflected sensitively since the amorphous metal layer is fluid and gas tight even with layer thicknesses in the $\mu$m region.

14 Claims, 6 Drawing Sheets

PRESSURE SENSOR HAVING AN INSULATING LAYER AND FLUID TIGHT AMORPHOUS METAL LAYER

BACKGROUND OF THE INVENTION

The invention relates to a pressure or differential pressure sensor 1 as well as a method for producing such a sensor.

Measuring pressure or differential pressure in fluids forms one of the most important tasks in the observation of technical installations. Nowadays instead of manometers, sensors are increasingly applied which, depending on the pressure or differential pressure, produce or modify an electrical signal. Such sensors are not only preferable with respect to the constructional size and measurement accuracy, but also particularly allow a simple integration in electronic control, observation and likewise.

Sensors according to the preamble type are for example known from U.S. Pat. No. 4,686,764 and U.S. Pat. No. 4,732,042. The membranes of these known sensors, which are impingable on one side by changing pressure, or, in the case of application as a differential pressure sensor, on both sides, are comprised of silicon. Measuring elements in the form of resistances are deposited on these silicon membranes, these resistances able to be contacted and switched as measuring bridges in the usual manner by way of strip conductors likewise deposited on the membrane on the edges thereof. By way of detuning the measuring bridge, the deflection of the membrane and thus the prevailing pressure or the difference in prevailing pressures may be determined. Such switching arrangements have been known for some time (strain gauges).

Since the change in resistance of the measuring resistances deposited on the membrane is also dependent on temperature, as a rule, directly next to the deflection region of the membrane, a compensation resistance, via which a temperature compensation of the measurement is effected, is deposited on said membrane.

Although the membrane composed of silicon with the measuring element deposited thereon allows a measurement with comparatively high accuracy within a small space, the membrane and the electronics located thereon are sensitive, so that they require protection, via which direct contact of the fluid with the membrane is prevented. According to the previously mentioned US patents, such a protection is formed by a layer of gel deposited on the membrane, whereby the gel layer is arranged in a constant volume space and covered by a rubber membrane. The fluid whose pressure is to be measured thus contacts this rubber membrane, the forces directed thereon are transfered through the rubber membrane to the gel and then to the silicone membrane. It is also known to dispense with the rubber membrane and to provide the silicon membrane with a protective gel and to arrange it in a housing which is only connected to the fluid, whose pressure is to be measured, in a pressure conducting manner by way of a comparatively small opening.

The disadvantage of these arrangements is on the one hand the high constructional effort in protecting the membrane and on the other hand the deterioration of the measuring characteristics due to the protection. The thicker and tougher this protective layer actually is, the more inaccurate becomes the measurement. On the other hand the protective layer must ensure a reliable and lasting protection of the silicon membrane, since direct contact with the fluid as a rule leads to permanent damage of the membrane and thus leads to the destruction of the sensor. Furthermore with the known designs, the contacting of the measuring elements located on the membrane is complicated. As a rule it is effected via individual bare wires which are connected via bonds to a strip conductor on the membrane and a strip conductor on a circuit board which is arranged at a slight distance to the membrane and comprises further electronic components where appropriate. The wires must be led out of the pressure space into the other part of the sensor in a pressure tight manner.

BRIEF SUMMARY OF THE INVENTION

Proceeding from this, it is the object of the invention to so design a pressure sensor or differential pressure sensor, that the previous disadvantages are largely done away with so that in a simple design manner, a sensor is formed of which the membrane on the one hand is sensitively deflectable but on the other hand is reliably protected against external influences due to the inpinging fluid. Furthermore the sensor should be simple in manufacture and inexpensive to produce.

In one aspect, this invention comprises a pressure or differential sensor comprising a membrane comprising at least one measuring element located thereon, evaluation electronics for measuring a membrane deflection, a protection layer and a mounting gripping the membrane in a pressure tight manner, the protection layer comprising an electrically insulating layer deposited directly onto the evaluation electronics membrane and a fluid-tight amorphous metal layer deposited on said electrically insulating layer.

In another aspect, this invention comprises a method for producing a pressure or differential pressure sensor, in particular according to one of the preceding claims, characterized in that in thin film technology. Thick film technology or silicon technology, a membrane provided with a measuring element is provided with an electrically insulating layer by coating, as well being subsequently provided with an amorphous metal layer by vapor deposition.

Accordingly, the invention provides for the protection of the membrane to be formed by an electrically insulating layer which is directly deposited on the membrane, the measuring element located thereon and where appropriate further electronic components located thereon, and which is covered over by at least a fluid tight amorphous metal layer. The electrically insulating layer may be extremely thin, since it merely has the job of ensuring that the amorphous metal layer does not short circuit the conductor and the electronic components arranged on the membrane. On the other hand, this layer is protected by the covering with the amorphous metal layer. As a rule then, this layer may be so formed that it does not significantly inhibit the deflection of the membrane and thus the measuring accuracy. The amorphous metal layer lying thereover on the other hand ensures an effective protection of the membrane, the measuring element located thereon, and where appropriate electronic components located thereon, as well as the electrically insulating layer. Due to the fact that the metal layer is not of a crystalline structure but an amorphous structure—this is also described as metal glass—it is highly resistant to corrosion on the one hand and on the other hand, even with the thinnest layer thickness it is liquid and gas tight. Such amorphous metal layers are for example known from EP-A-0537710, DE-A-4216150 and DE-A-3814444. With regard to these, the following publications are refered to: Palmström, C. J.; J. Gyulai and J. W. Mayer in J. Vac. Sci Technol. A1C21, April–June 1983, pages 452 ff.

Such a metal layer may also be extremely thin so that it has practically no interfering effect on the deflection of the membrane and thus ensures a high measurement accuracy.

Preferably the membrane is formed in the known manner from silicon, this being such that a roughly plate shaped substrate from silicon is produced which comprises only a central part of a lesser thickness forming the actual membrane. This silicon substrate may then be provided, in a known manner, using thin film technology, thick film technology or silicon technology, with the measuring element or elements, in particular resistances as well as strip conductors and where appropriate, further electronic components (for example resistances for temperature compensation). The electrically insulating layer lying thereon is preferably composed of polyimide, silicon oxide or silicon nitride, since these materials ensure a good insulating effect with a comparatively small layer thickness. The amorphous metal layer of metal glass is then arranged thereover, this layer preferably being chrome-tantalum or chrome-titanium based. It is useful that the electrically insulating layer as well as the amorphous metal layer is applied to both sides of the membrane, since then this may be used with pressure as well as with differential pressure sensors. The amorphous metal layer is electrically conducting and may be usefully used for shielding the electronics lying thereunder, for example by earthing or voltage application. Voltage application may also be used for preventing or reducing corrosion as well as deposits.

In order to ensure the fluid density of the amorphous metal layer, the layer thickness is to be at least 0.1 μm, this corresponds to 700 atom layers. On the other hand, the metal layer should influence the mobility of the silicon membrane as little as possible. As far as this is concerned the maximum layer thickness should be 5 μm. A range between 0.5 and 1.5 μm is preferred, which on the one hand ensures a reliable impermeability of the amorphous metal layer and on the other hand a good mobility of the membrane. It is particularly advantageous that the chosen layer material only deforms elastically in the deflection range so that hysteresis effects are avoided.

Preferably, the contacting of the conductors arranged on the membrane or the substrate is effected on the other side of pressure tight gripping within the mounting. The pressure tight leadthrough of the conductors can therefore be omitted, by which means the constructional effort can be considerably reduced. Moreover because of this, the otherwise necessary additional protection of these thin wires, which are very delicate, is done away with.

The gripping of the membrane or the substrate within the mounting is effected either by two O-rings, lying on both sides of the membrane, surrounding the membrane and sealing with respect to the mounting, or by adhesing within the mounting. The gripping is usefully effected symmetrically on both sides of the substrate in order to prevent distortion.

The holder itself in the region around the membrane preferably is composed of two plate shaped components, of which one comprises a recess for receiving the membrane or substrate and between which the membrane is gripped or cemented. Within this plate shaped component, there are provided on both sides of the membrane openings which are flush with one another, through which the fluid is communicatingly connected with the membrane. With such an arrangement, the previously mentioned sealing rings, for example O-rings, may lie in annular grooves extending around these openings and holding the sealing elements with a positive fit.

The membrane is preferably formed of one piece with a substrate surrounding it, whereby the substrate is to be considered as essentially rigid with respect to the membrane, and comprises a correspondingly larger thickness. Preferably the electrically insulating layer is not only deposited onto the membrane, the measurring element or elements located thereon as well as, where necessary, further electronic components, but also over the whole surface area of the substrate with the exception of the contact zones, and this being on both sides. This is usefully effected by way of an appropriate depositing method, the subsequent depositing of the amorphous metal layer by vacuum metallizing on both sides. Since the metal layer would be somewhat of a problem in the regions in which the later contacting of the conductors located on the substrate is to be effected, these regions of the substrate are first covered by way of a photo technical or other suitable process, so that the metal layer in these regions can be removed after deposition by way of dissolving the covering layer.

In a particularly inexpensive manner, the membrane or substrate according to the invention is not produced individually but in the form of a wafer. Thus a multitude of substrates arranged next to one another with membranes located therein are produced in the form of a wafer using thin film technology, thick film technology or silicon technology, thereafter the insulating layer, as well as subsequently the amorphous metal layer are deposited and where appropriate again removed in the previously covered regions. Only then is the wafer split into the individual membranes or substrates. In this way, the sensor according to the invention may be cheaply manufactured in middle or large series production. The contacting of the conductors located on the membrane or the substrate is usefully effected after gripping the substrate in the mounting, since then the membrane lies already largely protected within the mounting and the contacting may be effected in a completely mechanized manner using appropriate handling machines.

BRIEF DESCRIPTION OF THE SEVERAL VIEWS OF THE DRAWING

The invention is hereinafter described in more detail by way of the embodiment examples shown in the drawings. These show.

DETAILED DESCRIPTION OF THE INVENTION

Figure 1:
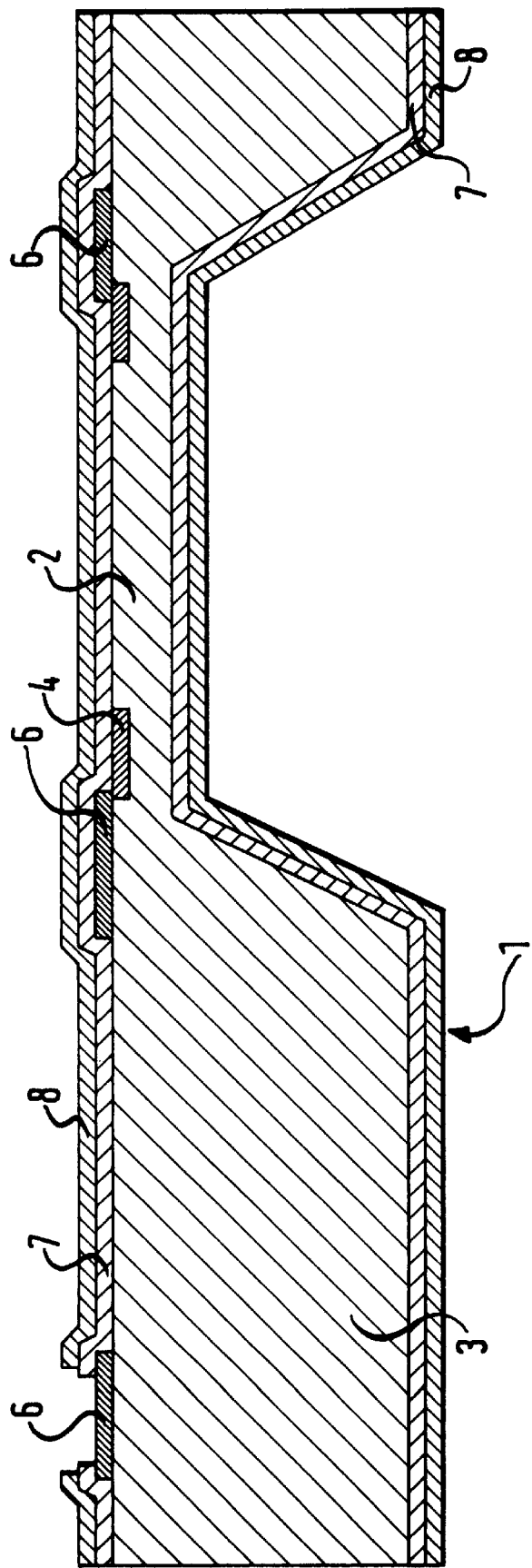
FIG. 1 a longitudinal section through a substrate with a membrane located therein, in a schematic representation, FIG. 2 a plan view of a substrate according to FIG. 1, but without covering layers, FIG. 3 a longitudinal section through the mounting in the region of the gripping location in a much simplified representation, FIG. 4 another embodiment of the gripping in the representation according to FIG. 3, FIG. 5 a part of the mounting with the sealing element and substrate, in exploded representation and FIG. 6 a further part of the mounting of FIG. 5.
Figure 2:
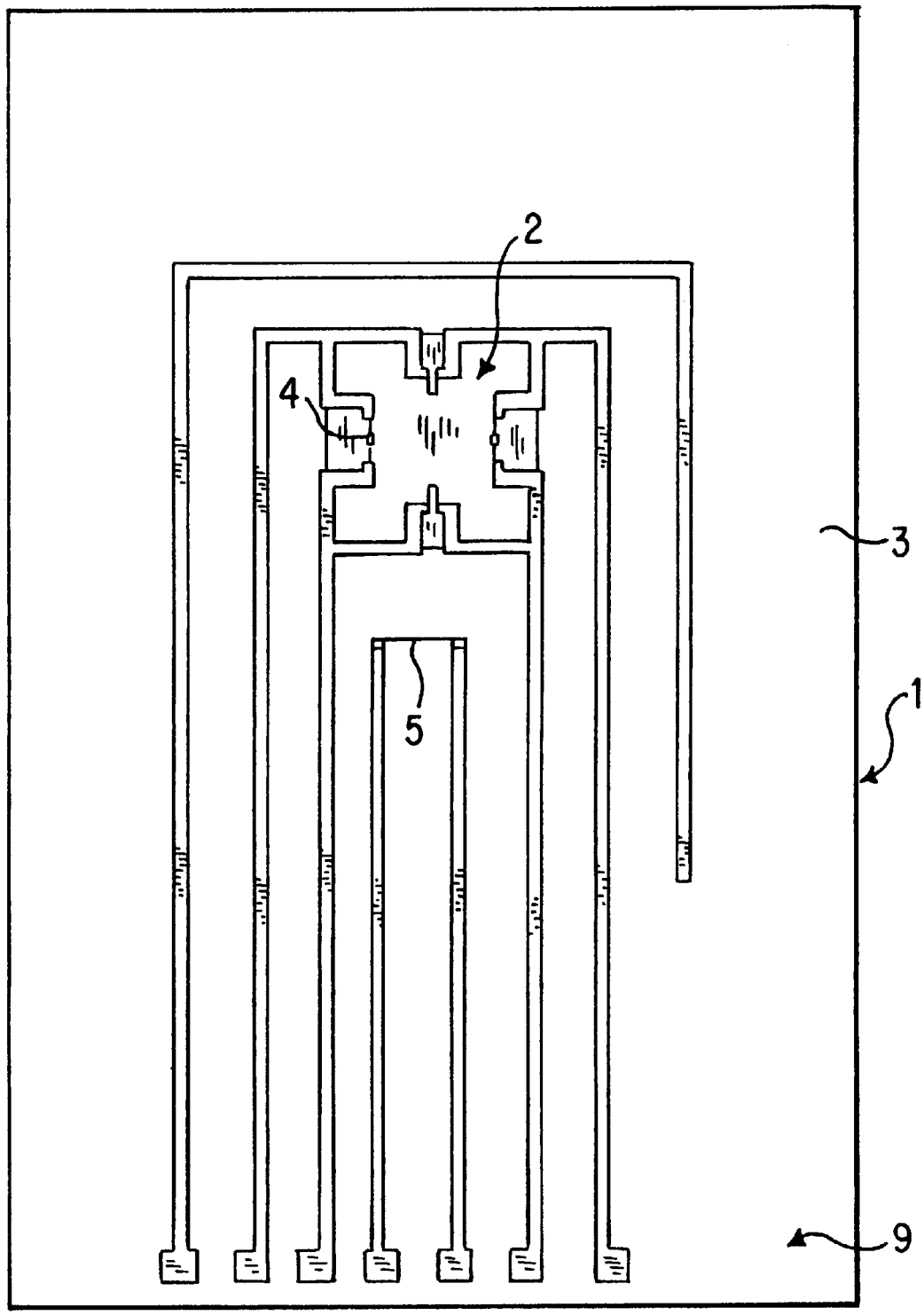

The substrate 1, represented by way of FIGS. 1 and 2, in the plan view, has a roughly rectangular shape. It comprises a much reduced thickness in a middle, roughly quadratic region. This region 2 forms the membrane of a pressure or differential pressure sensor, whilst the remaining substrate is to be regarded as essentially rigid. The substrate 1 and the membrane 2 are formed from silicon. In the region of the membrane, four resistances 4 for determining the membrane deflection as well as a further resistance 5, directly neighbouring the membrane 2, for temperature compensation of the sensor, are deposited on the silicon base body 3. The electrical connection of the resistances 4 and 5 is effected via strip conductors 6 made from aluminium, which are likewise deposited directly onto the substrate 1. The arrangement of the conductors to the resistances 4 is already preparedly formed as a bridge circuit which lays the contact points to the strip conductors 6 for further wiring all along one side of the substrate, this being distant to the membrane 2.

The membrane 2 and substrate 1 are covered on both sides with a silicon oxide layer 7. This layer 7 is directly deposited onto the silicon base body 3 or the resistances 4 and 5 as well as the strip conductors 6. The silicon oxide layers 7 on both sides of the substrate I are each covered by a metal glass layer 8. This amorphous metal layer is vapor deposited and comprises a thickness of about 1 μm, which is about 7,000 atom layers. The metal glass layer 8 is impervious to fluid and gas. It has a considerably higher resistance to corrosion and greater hardness in comparison to crystalline stainless steels. It however practically does not inhibit the measuring characteristics of the membrane 2, since this layer deforms only elastically. Thus it protects the membrane from external influences in an almost optimal manner. In order to prevent a short circuit by the metal glass layer 8 of the resistances and strip conductors formed on the silicon base body 3, the electrically insulating silicon oxide layer 7 is provided.

With the embodiment example described, the metal glass layer 8 is comprised from an amorphous metal alloy based on chrome-tantalum or chrome-titanium. In this respect the document EP-A-0537710 is referred to.

As shown in FIG. 2, a strip 9 is provided running parallel to the narrow side of the substrate 1 and in which the strip conductors 6 are neither covered by a silicon oxide layer 7 nor by a metal glass layer 8. Here the strip conductors 6 run out for the purpose of contacting (bonding).

Figure 3:
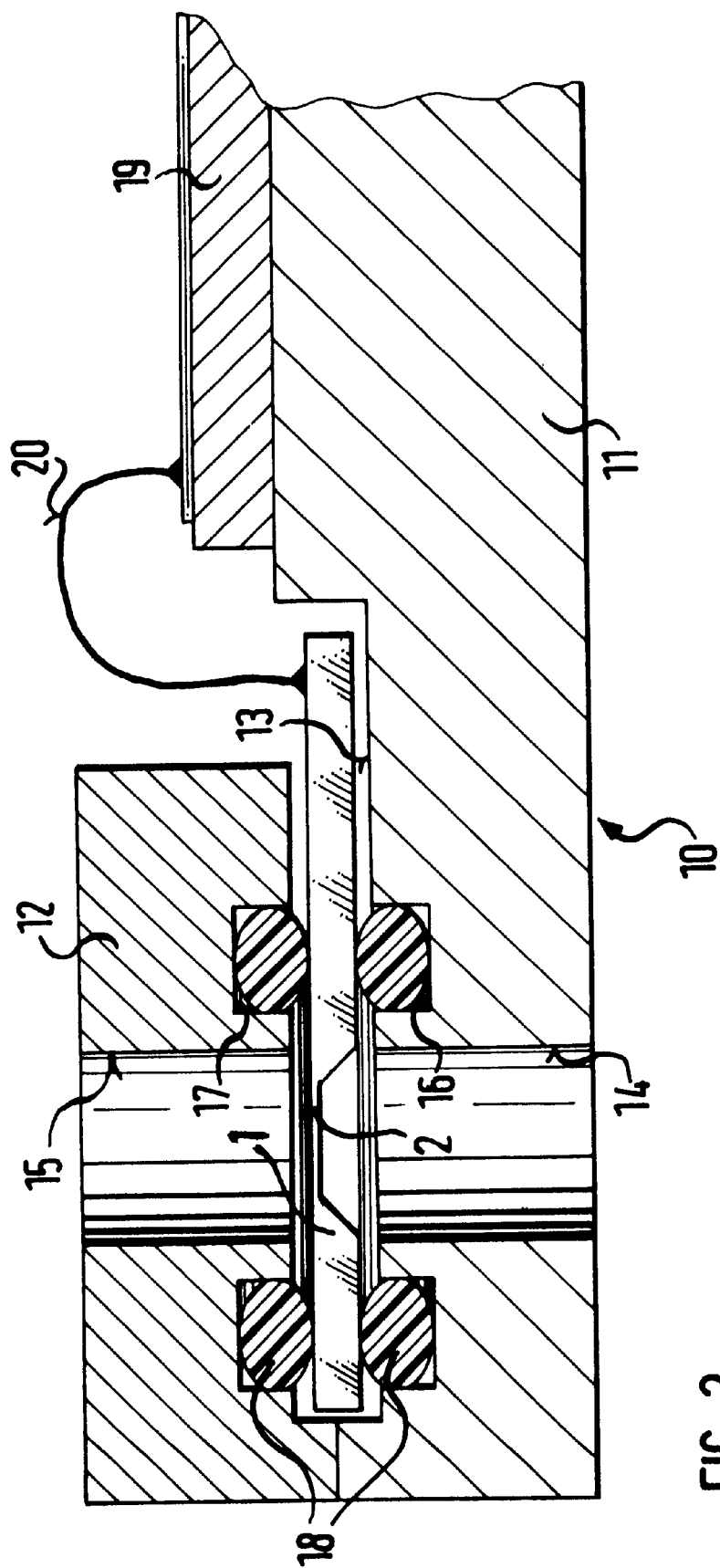

The previously described substrate is incorporated in a pressure tight manner into a mounting 10, in an such a manner that the membrane 2 is impingable on both sides. This is shown schematically by way of FIG. 3. Here the mounting 10 comprises a plate shaped base body 11 and a cover plate 12 which are connected to one another under incorporation of the substrate. The plate shaped base body 11 comprises a plane recess 13, roughly the size of the substrate 1, for receiving this substrate. Furthermore, the base body 11 and the cover plate 12 comprise recesses 14 and 15 which are flush with one another and through which the membrane 2 can be impinged by fluid. Concentric to their recesses 14 and 15, the components 11 and 12 each comprise annular grooves 16 and 17, in which O-rings lie, which grip the substrate between the components 11 and 12 in an airtight manner. The arrangement is chosen such that the membrane 2 is freely accessible within the recesses 14 and 15, whilst the strip 9 which is provided for contacting the ends of the strip conductors 6, lies on the other side of the seal within the mounting 10. Moreover, the mounting is so formed that only the region of the recesses 14 and 15 can be impinged by fluid, but the remaining part is sealed with respect to the fluid. Arranged on the base body 11 is a circuit board 19 which comprises further electronic components for processing the measuring signal. This circuit board 19 is electrically connected to the strip conductors 6 of the substrate 1 via a conductor 20. The contacting is effected by soldering or welding the conductor 20 onto the ends of the strip conductors 6 made freely accessible by way of the strips 9 (so-called bonding).

Figure 5:
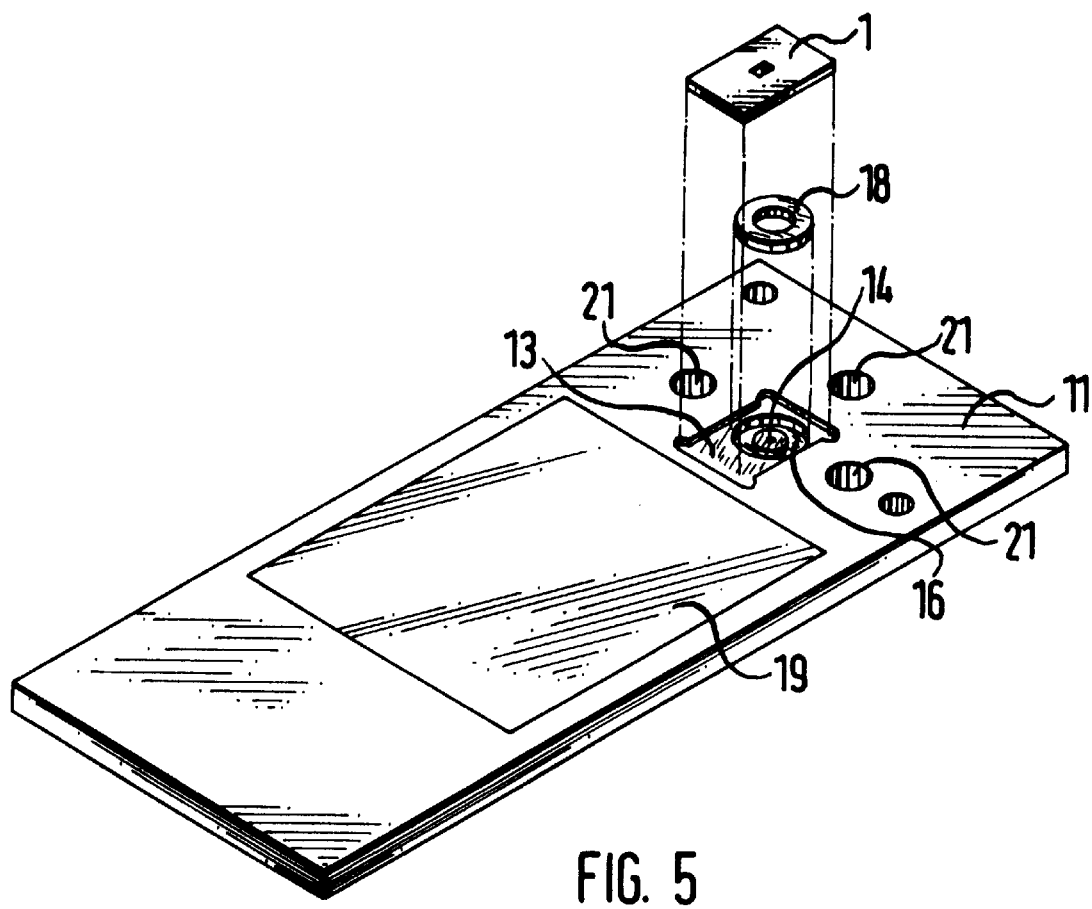
Figure 6:
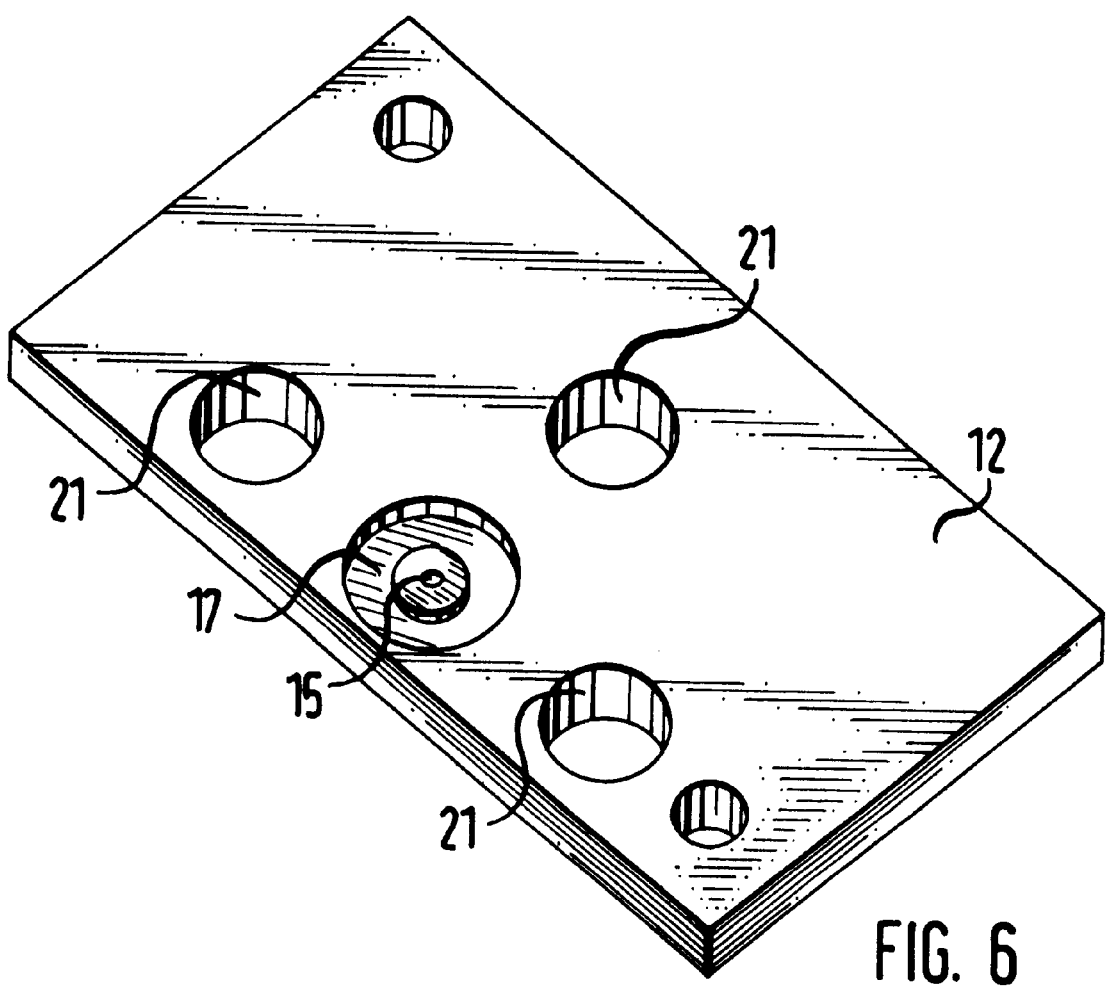

The electronic, electrical and structural construction of the differential pressure sensor is accomplished in the usual way and is thus not described in detail here. The construction, as far as the mounting is concerned, is made clearer by way of FIGS. 5 and 6. Here, for connecting the plate shaped components 11 and 12, bores 21 are arranged next to the recess 13 flush in the base body 11 and cover plate 12, through which a screw or rivet connection can be made between the two components.

Such a designed sensor may be applied as a pressure sensor when the membrane 2 is only impinged on by pressuere from one side. For application as a differential pressure sensor, the membrane is impinged on by fluid from both sides.

Figure 4:
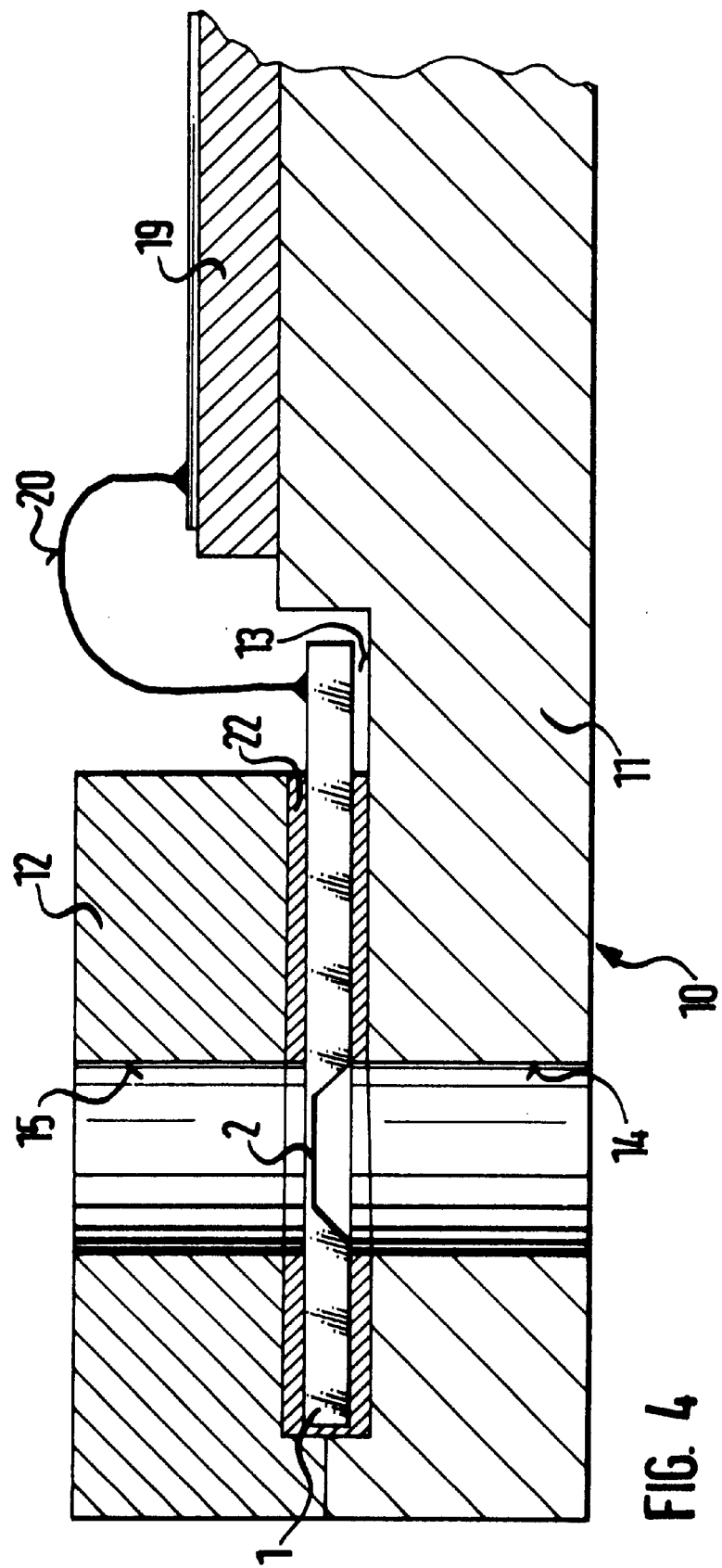

By way of FIG. 4 and alternative gripping of the substrate 1 between the components 11 and 12 is represented. This embodiment example differs from that represented by way of FIG. 3 in that the annular grooves 16, 17 as well as the O-rings are done away with and instead the substrate 1 is incorporated between the plate shaped base body 11 and the cover plate 12 by way of an adhesive layer 22. This incorporation is advantageous inasmuch as the occuring stress in the substrate 1 and in the membrane is much less than with the previously described gripping. This is advantageous with regard to the measuring accuracy and linearity of the measurement. In any case, however, the gripping of the substrates 1 between the components 11 and 12 is effected before the contacting of the ends of the strip conductors 6, since the comparatively sensitive substrate 1 after incorporation into the holder 10 is much more simple and secure to operate.

What is claimed is:

1. A pressure or differential sensor comprising:
   a membrane comprising at least one measuring element located thereon;
   evaluation electronics for measuring a membrane deflection;
   a protection layer;
   a mounting which grips the membrane in a pressure-tight manner;
   said protection layer comprising an electrically insulating layer deposited directly onto said evaluation electronics and said membrane; and
   a fluid tight amorphous metal layer deposited on said electrically insulating layer.

2. The sensor as recited in claim 1, wherein at least one conductor is situated under said electrically insulating layer and is formed to permit said conductor to be contacted from an outside of said mounting layer.

3. The sensor as recited in claim 1 wherein said membrane comprises silicon and said electrically insulating layer comprises at least one of silicon oxide, silicon nitrite or polyimide and said amorphous metal layer comprises a metal glass based upon at least one of chrome-tantalum or chrome titanium.

4. The sensor as recited in claim 1 wherein said membrane is formed as one piece with a plate-shaped substrate, whereby said mounting grips said membrane in a region of said plate-shaped substrate.

5. The sensor as recited in claim 1 wherein said amorphous metal layer comprises a thickness between 0.1 micrometers to 5 micrometers.

6. The sensor as recited in claim 1 wherein a sealing element is interposed between said membrane and said mounting.

7. The sensor as recited in claim 1 wherein said sensor comprises an adhesive to secure said membrane to said mounting.

8. The sensor as recited in claim 1 wherein said mounting comprises two plate-shaped components which cooperate to define a recess for receiving said membrane, said plate-shaped components each comprising an aperture which are substantially aligned to one another.

9. The sensor as recited in claim 8 wherein each of said plate-shaped components further comprise an annular groove for receiving an annular sealing element.

10. The sensor as recited in claim 1 wherein said amorphous metal layer is electrically coupled to either a voltage source or ground.

11. The sensor as recited in claim 4 wherein said plate-shaped substrate is electrically insulated in a region of said mounting to permit said plate-shaped substrate to be gripped.

12. The sensor as recited in claim 5 wherein said thickness is between 0.5 micrometers and 1.5 micrometers.

13. The sensor as recited in claim 6 wherein said sealing element comprises at least one O-ring.

14. The sensor as recited in claim 9 wherein said annular sealing element comprises an O-ring.

* * * * *